(12) United States Patent
Hwang et al.

(10) Patent No.: US 10,916,854 B2
(45) Date of Patent: Feb. 9, 2021

(54) ANTENNA STRUCTURE WITH INTEGRATED COUPLING ELEMENT AND SEMICONDUCTOR PACKAGE USING THE SAME

(71) Applicant: MEDIATEK INC., Hsin-Chu (TW)

(72) Inventors: Jiunn-Nan Hwang, Hsin-Chu (TW); Yi-Chieh Lin, Hsin-Chu (TW); Yen-Ju Lu, Hsin-Chu (TW); Shih-Chia Chiu, Hsin-Chu (TW); Wen-Chou Wu, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/293,661

(22) Filed: Mar. 6, 2019

(65) Prior Publication Data
US 2019/0305428 A1 Oct. 3, 2019

Related U.S. Application Data

(60) Provisional application No. 62/649,623, filed on Mar. 29, 2018.

(51) Int. Cl.
*H01Q 9/04* (2006.01)
*H01Q 1/22* (2006.01)
(Continued)

(52) U.S. Cl.
CPC ....... *H01Q 9/045* (2013.01); *H01L 23/49816* (2013.01); *H01L 23/49822* (2013.01);
(Continued)

(58) Field of Classification Search
None
See application file for complete search history.

(56) References Cited

U.S. PATENT DOCUMENTS

| 8,842,054 B2 | 9/2014 | Zhang | |
| 2008/0088510 A1* | 4/2008 | Murata | H01Q 19/28 343/700 MS |

(Continued)

FOREIGN PATENT DOCUMENTS

| CN | 102292873 A | 12/2011 |
| CN | 102694245 A | 9/2012 |

(Continued)

OTHER PUBLICATIONS

Bing Zhang et al., Integration of Quadruple Linearly-Polarized Microstrip Grid Array Antennas for 60-GHz Antenna-in-Package Applications, IEEE Transactions on Components, Packaging and Manufacturing Technology, vol. 3, No. 8, Aug. 2013, pp. 1293-1300, XP011522971.

*Primary Examiner* — Jany Richardson
(74) *Attorney, Agent, or Firm* — Winston Hsu (57) ABSTRACT

An antenna structure includes a radiative antenna element disposed in a first conductive layer, a reflector ground plane disposed in a second conductive layer under the first conductive layer, a feeding network comprising a transmission line disposed in a third conductive layer under the second conductive layer, and at least one coupling element disposed in proximity to a feeding terminal that electrically couples one end of the transmission line to the radiative antenna element. The coupling element is capacitively coupled with the feeding terminal.

18 Claims, 9 Drawing Sheets

(51) Int. Cl.
*H01Q 1/48* (2006.01)
*H01Q 19/10* (2006.01)
*H01Q 21/06* (2006.01)
*H01Q 21/00* (2006.01)
*H01Q 11/04* (2006.01)
*H01Q 19/00* (2006.01)
*H01L 23/498* (2006.01)
*H01L 23/66* (2006.01)
*H05K 1/02* (2006.01)
*H05K 1/11* (2006.01)
*H05K 1/18* (2006.01)
*H01L 23/00* (2006.01)
*H05K 1/03* (2006.01)

(52) U.S. Cl.
CPC ........ *H01L 23/49838* (2013.01); *H01L 23/66* (2013.01); *H01Q 1/2283* (2013.01); *H01Q 1/48* (2013.01); *H01Q 11/04* (2013.01); *H01Q 19/005* (2013.01); *H01Q 19/104* (2013.01); *H01Q 21/0006* (2013.01); *H01Q 21/0075* (2013.01); *H01Q 21/065* (2013.01); *H05K 1/0243* (2013.01); *H05K 1/112* (2013.01); *H05K 1/181* (2013.01); *H01L 24/16* (2013.01); *H01L 24/20* (2013.01); *H01L 2223/6616* (2013.01); *H01L 2223/6627* (2013.01); *H01L 2223/6677* (2013.01); *H01L 2224/04105* (2013.01); *H01L 2224/16227* (2013.01); *H01L 2924/15321* (2013.01); *H01L 2924/19032* (2013.01); *H05K 1/0306* (2013.01); *H05K 1/0313* (2013.01); *H05K 2201/10098* (2013.01); *H05K 2201/10734* (2013.01)

(56) References Cited

U.S. PATENT DOCUMENTS

| | | |
|---|---|---|
| 2012/0287019 A1 | 11/2012 | Sudo |
| 2014/0252595 A1 | 9/2014 | Yen |
| 2016/0276733 A1* | 9/2016 | Kasahara ............ H01Q 19/005 |

FOREIGN PATENT DOCUMENTS

| | | |
|---|---|---|
| CN | 102714357 A | 10/2012 |
| CN | 104037166 A | 9/2014 |
| CN | 104681949 A | 6/2015 |
| EP | 1 093 677 | 4/2001 |
| EP | 1093677 A2 | 4/2001 |
| JP | 2006-261941 A | 9/2006 |
| JP | 2006261941 A | 9/2006 |
| JP | 2007-158555 A | 6/2007 |
| JP | 2007158555 A | 6/2007 |

* cited by examiner

ANTENNA STRUCTURE WITH INTEGRATED COUPLING ELEMENT AND SEMICONDUCTOR PACKAGE USING THE SAME

CROSS REFERENCE TO RELATED APPLICATIONS

This application claims benefits from U.S. provisional application No. 62/649,623 filed Mar. 29, 2018, which is included herein in its entirety by reference.

BACKGROUND

The present disclosure relates to an antenna structure. More particularly, the present disclosure relates to an antenna structure with an integrated coupling element and an antenna-in-package (AiP) having such antenna structure.

As known in the art, a grid array antenna (GAA) structure is typically composed of rectangular meshes of microstrip lines on a dielectric substrate backed by a metallic ground plane and fed by a metal via through an aperture on the ground plane. Depending on the electrical length of the sides of the meshes, the grid array antenna may be resonant or non-resonant.

However, conventional grid array antenna does not perform well at millimeter wave (mm-wave) frequencies (e.g., 77~89 GHz). Therefore, it is desirable to provide an improved grid array antenna with high-gain radiation pattern and easy-controlled operation bandwidth.

SUMMARY

It is one object of the present disclosure to provide an improved antenna structure and an antenna-in-package (AiP) having such antenna structure, which have high-gain radiation pattern and easy-controlled operation bandwidth.

According to one aspect of the present disclosure, an antenna structure is provided. The antenna structure includes a radiative antenna element disposed in a first conductive layer, a reflector ground plane disposed in a second conductive layer under the first conductive layer, a feeding network comprising a transmission line disposed in a third conductive layer under the second conductive layer, and at least one coupling element disposed in proximity to a feeding terminal that electrically couples one end of the transmission line to the radiative antenna element. The coupling element is capacitively coupled with the feeding terminal.

According to some embodiments, the coupling element comprises a conductive pad and a connector that electrically couples the conductive pad to the reflector ground plane.

According to some embodiments, the antenna structure is configured to operate with a predetermined RF signal having a RF frequency and a corresponding wavelength λ, wherein a distance between the conductive pad and the radiative antenna element is equal to or smaller than 0.4λ.

According to some embodiments, the RF frequency comprises an impedance bandwidth ranging between 76 GHz~81 GHz.

According to some embodiments, the conductive pad is disposed in the first conductive layer and is coplanar with the radiative antenna element.

According to some embodiments, the antenna structure further comprising: a substrate having a top surface and a bottom surface.

According to some embodiments, the substrate comprises a ceramic substrate, a semiconductor substrate, a dielectric substrate, or a glass substrate.

According to some embodiments, the substrate comprises a package substrate or a printed circuit board.

According to some embodiments, the first conductive layer is disposed on the top surface of the substrate and the second conductive layer is disposed on the bottom surface of the substrate.

According to some embodiments, the reflector ground plane is disposed on the bottom surface of the substrate.

According to some embodiments, the first conductive layer, the second conductive layer, and the third conductive layer are disposed on the top surface of the substrate.

According to some embodiments, the antenna structure further comprising: a re-wiring structure disposed on the bottom surface of the substrate, wherein the third conductive layer and the transmission line are disposed in the re-wiring structure.

According to some embodiments, the feeding terminal is comprised of a connector in the substrate and a via in the re-wiring structure.

According to some embodiments, the connector is a plated through hole, and wherein the plated through hole is aligned with the via.

According to some embodiments, the reflector ground plane comprises an aperture for accommodating the feeding terminal, and wherein the feeding terminal passes through the aperture of the reflector ground plane and is not in contact with the reflector ground plane.

According to some embodiments, the radiative antenna element comprises a grid array antenna.

According to some embodiments, the grid array antenna comprises a single-feeding grid array antenna or a dual-feeding grid array antenna.

According to some embodiments, the radiative antenna element comprises a patch array antenna.

According to another aspect of the present disclosure, an antenna structure includes a radiative antenna element disposed in a first conductive layer, a reflector ground plane disposed in a second conductive layer under the first conductive layer, a feeding network comprising a transmission line disposed in a third conductive layer under the second conductive layer, and two coupling elements sandwiching about a feeding terminal that is disposed to electrically couple one end of the transmission line to the radiative antenna element. The two coupling elements are capacitively coupled with the feeding terminal.

According to another aspect of the present disclosure, an antenna-in-package includes an antenna structure as described above, and a semiconductor chip embedded in or mounted on a substrate and electrically coupled to the antenna structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described insufficient detail to enable those skilled in the art to practice them, and it is to be understood that other embodiments may be utilized and that mechanical, structural, and procedural changes may be made without departing from the spirit and scope of the present disclosure. The following detailed description is, therefore, not to be taken in a limiting sense, and the scope of embodiments of the present invention is defined only by the appended claims.

It will be understood that, although the terms first, second, third, primary, secondary, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first or primary element, component, region, layer or section discussed below could be termed a second or secondary element, component, region, layer or section without departing from the teachings of the present inventive concept.

Spatially relative terms, such as "beneath", "below", "lower", "under", "above," "upper," "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" or "over" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

It is noted that: (i) same features throughout the drawing figures will be denoted by the same reference label and are not necessarily described in detail in every drawing that they appear in, and (ii) a sequence of drawings may show different aspects of a single item, each aspect associated with various reference labels that may appear throughout the sequence, or may appear only in selected drawings of the sequence.

The present disclosure pertains to an antenna structure with an integrated coupling element and an antenna-in-package (AiP) having such antenna structure. Some suitable package types may include, but not limited to, a fan-out wafer level package (FOWLP), a flip-chip chip-scale package (FCCSP), or a semiconductor-embedded in substrate (SESUB). Further, the present disclosure may be applicable to antenna-on-board (AOB) applications. By providing the integrated coupling element in proximity to the feeding terminal, the antenna radiation pattern and operation bandwidth can be adjusted, and the antenna performance is significantly improved. The antenna structure may comprise a grid array antenna (GAA) including, but not limited to, single-feeding GAA, dual-feeding separated GAA, or dual-feeding combined GAA. The antenna structure may be a single-feeding patch array antenna or the like. The disclosed antenna structure with an integrated coupling element is suited for radar sensor for automobile applications or 5G mobile communication systems, but not limited thereto.

Figure 1:
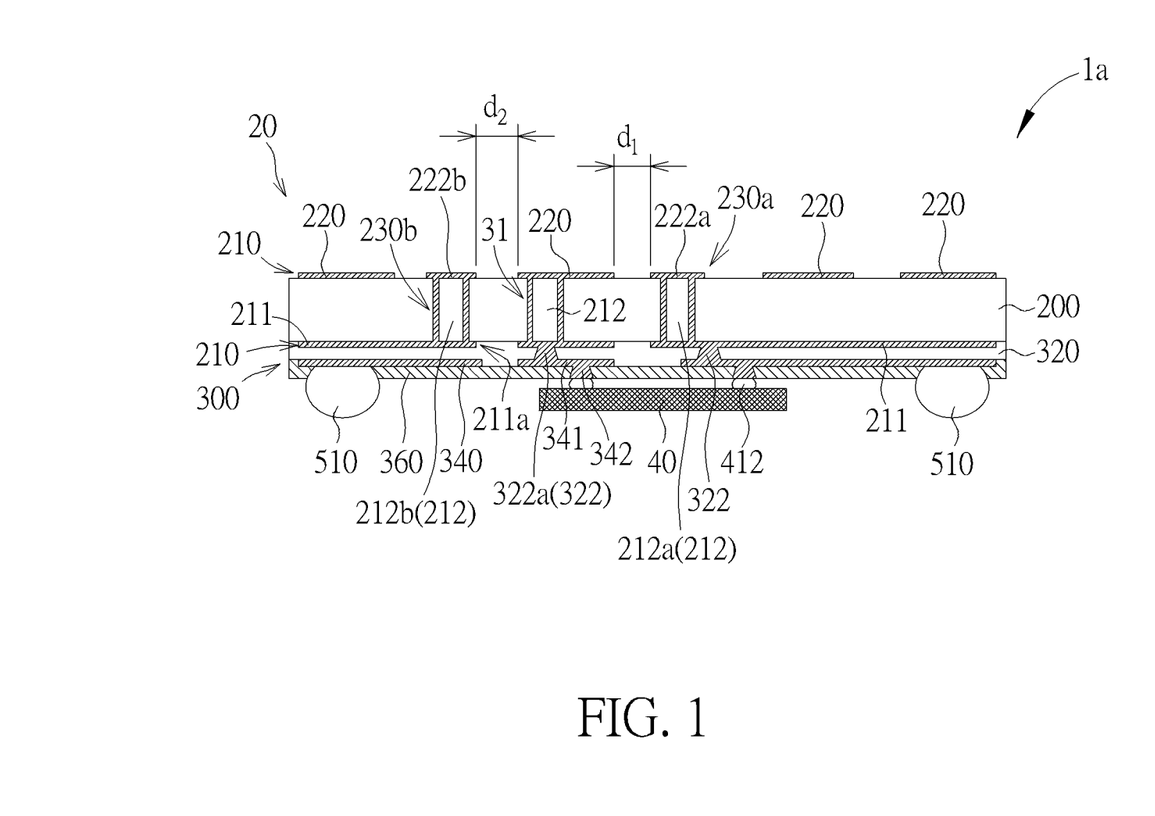
FIG. 1 is a schematic, cross-sectional diagram showing an exemplary antenna-in-packages according to one embodiment of the invention.

FIG. 1 is a schematic, cross-sectional diagram showing an exemplary antenna-in-packages according to one embodiment of the invention. It is to be understood that the features of the various exemplary embodiments described herein may be combined with each other, unless specifically noted otherwise. For the sake of simplicity, only germane parts of the exemplary antenna packages are shown in the figures.

It is to be understood that although only three conductor traces/layers are shown in FIG. 1, the present disclosure is not limited to this exemplary embodiment. In other embodiments, more conductor traces/layers such as four layers, five layers, six layers, seven layers, or eight layers of conductors in the substrate or re-wiring structure may be implemented without departing form the scope of the invention.

As shown in FIG. 1, the antenna-in-package 1a comprises a substrate 200. An antenna structure 20 is disposed in and on the substrate 200. The antenna structure 20 is configured to operate with a predetermined RF signal such as mmW signal having a RF frequency (e.g., an impedance bandwidth ranging between 76 GHz~81 GHz) and a corresponding wavelength λ. For example, the substrate 200 may be a ceramic substrate, a semiconductor substrate, a dielectric substrate, a glass substrate, but is not limited thereto. According to one embodiment, the substrate 200 may be a package substrate or a printed circuit board (PCB) comprising, for example, FR4 materials or high-performance millimeter-wave PCB materials, but is not limited thereto. Conductive layers 210 are formed on opposite surfaces of the substrate 200. The substrate 200 comprises at least one connector 212 such as a plated through-hole or via to route signals from one side of the substrate 200 to the other side of the substrate 200. According to embodiments of the invention, for example, the antenna-in-package 1a may be a semiconductor package having a radio-frequency (RF) silicon chip/die or a wireless electronic component mounted therein or thereon.

According to one embodiment, a re-wiring structure 300 may be disposed on one surface of the substrate 200, for example, on a bottom surface of the substrate 200, as depicted in FIG. 1. In a non-limiting example, the re-wiring structure 300 may comprise a dielectric layer 320 laminated on the bottom surface of the substrate 200, an interconnect layer (or conductive layer) 340 patterned on the dielectric layer 320, and a protective layer 360 disposed on the interconnect layer 340. The dielectric layer 320 may comprise any suitable insulating layers such as silicon oxide, silicon nitride, polyimide or the like. The interconnect layer 340 may comprise copper, but is not limited thereto. The protective layer 360 may comprise any suitable passivation layers or solder masks. The interconnect layer 340 may be electrically connected to the conductive layer 210 through the vias 322 in the dielectric layer 320.

In a non-limiting example, a semiconductor chip 40 such as a RF silicon chip/die or a wireless electronic component may be mounted on the re-wiring structure 300. In other example, the semiconductor chip 40 may be a System-on-Chip (SoC) die equipped wireless electronic component which could perform wireless communication, such as RF wireless signals or mmW signals. The semiconductor chip 40 may be electrically connected to the interconnect layer 340 through the contact elements 342 and the conductive elements 412 such as conductive bumps, pillars or balls. Solder balls 510 such as ball grid array (BGA) may be provided around the semiconductor chip 40 and may be electrically connected to the interconnect layer 340 of the re-wiring structure 300.

According to one embodiment, the antenna structure 20 comprises a radiative antenna element 220, which may be disposed in the conductive layer 210 on a surface of the substrate 200, for example, on the top surface of the substrate 200, as depicted in FIG. 1. The radiative antenna element 220 may comprise an antenna array or a mechanism for radiating and/or receiving electro-magnetic signals such as RF wireless signals or mmW signals. Although not shown in this figure, it is understood that the radiative antenna element 220 may be disposed at a bottom surface of the substrate 200 depending upon the design requirements. For example, the radiative antenna element 220 may be of any suitable type, such as grid array antennas, patch antennas, stacked patches, dipoles, monopoles, etc., and may have different orientations and/or polarizations.

According to one embodiment, the interconnect layer 340 comprises a transmission line 341 (or transmission trace) of a feeding network for transmitting RF signals or mmW signals. One end of the transmission line 341 is electrically coupled to a feeding terminal 31 that is comprised of a connector 212 such as a plated through hole in the substrate 200 and a via 322a in the re-wiring structure 300. The other end of the transmission line 341 is electrically coupled to a pad of the semiconductor chip 40. According to one embodiment, the connector 212 is aligned with the via 322a. An upper end of the feeding terminal 31 is electrically coupled to the radiative antenna element 220. The RF signals such as mmW signals to or from the radiative antenna element 220 may be transmitted through the transmission line 341 in the conductor layer 340 and the feeding terminal 31.

According to one embodiment, the substrate 200 further comprises a solid ground plane 211 in the conductive layer 210 of the substrate 200. The ground plane 211, which is also referred to as a reflector ground plane, functions as a ground reflector of the antenna structure 20. For example, the ground plane 211 is disposed on the bottom surface of the substrate 200 and the ground plane 211 comprises an aperture 211a for accommodating the feeding terminal 31. The connector 212 of the feeding terminal 31 passes through the aperture 211a of the ground plane 211 and is not in contact with the ground plane 211.

According to one embodiment, the substrate 200 further comprises at least one coupling element that is capacitively coupled with the feeding terminal 31. For example, as depicted in FIG. 1, two coupling elements 230a and 230b are disposed in proximity to the feeding terminal 31. According to one embodiment, the coupling element 230a may comprise a conductive pad 222a and a connector 212a such as a plated through hole or via that electrically couples the conductive pad 222a to the ground plane 211. According to one embodiment, the coupling element 230b may comprise a conductive pad 222b and a connector 212b that electrically couple the conductive pad 222b to the ground plane 211. The distance $d_1$ between the conductive pad 222a and the radiative antenna element 220 may be equal to or smaller than 0.4λ. The distance $d_2$ between the conductive pad 222b and the radiative antenna element 220 may be equal to or smaller than 0.4λ. The distance $d_1$ may be equal to or different from the distance $d_2$.

Figure 2:
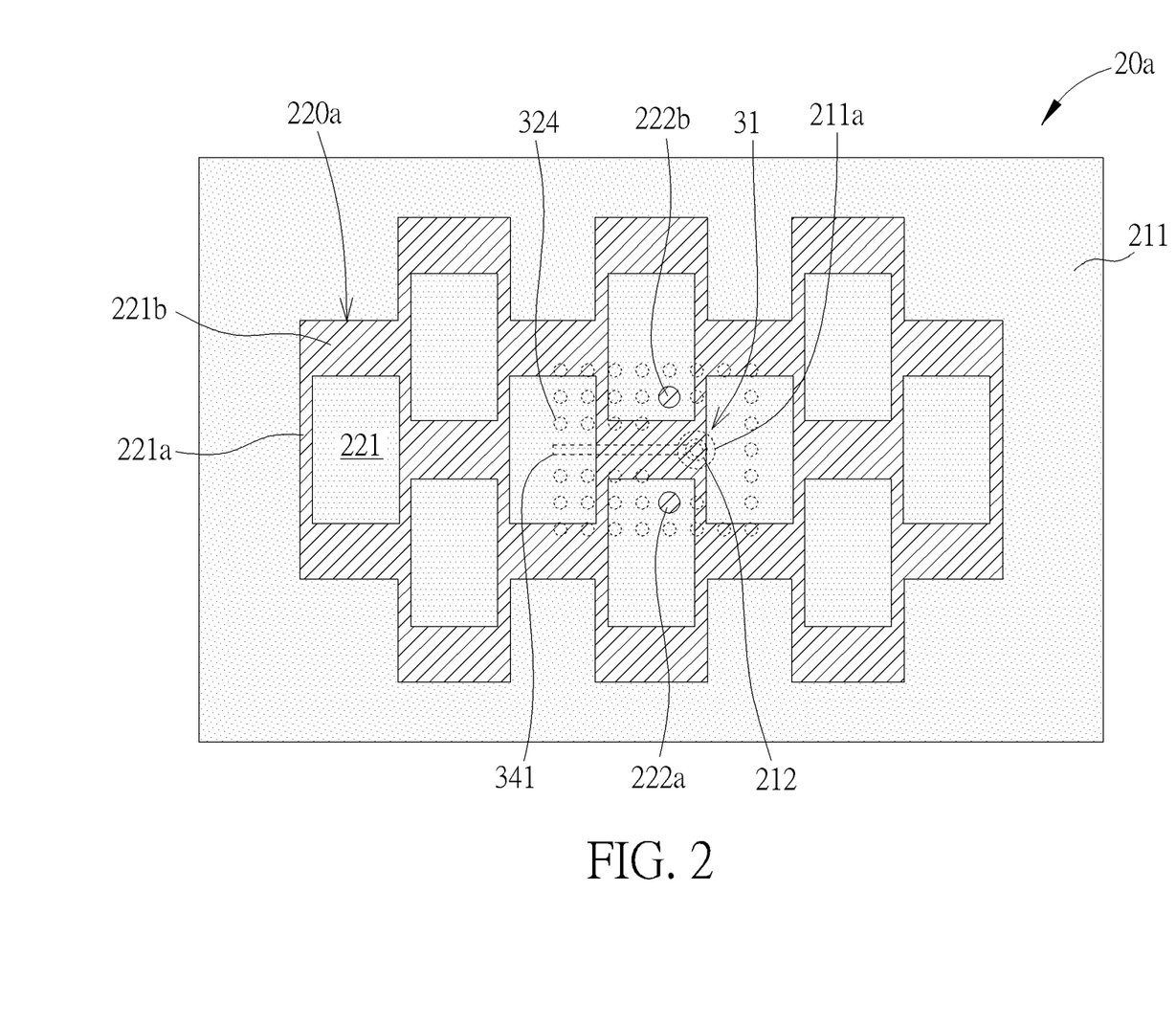
FIG. 2 is a schematic top view of a single-feeding grid array antenna (GAA) according to one embodiment of the invention.
Figure 3:
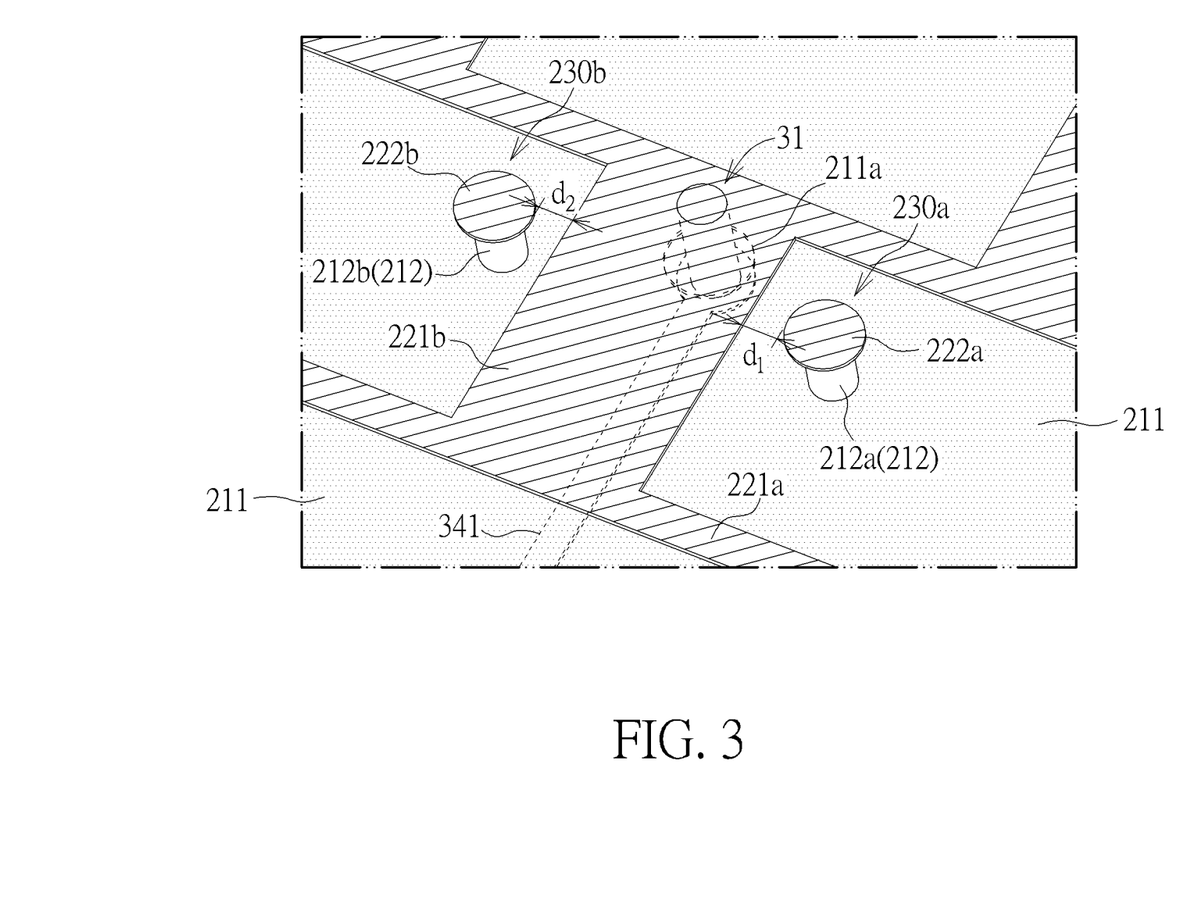
FIG. 3 is a perspective view showing an enlarged portion of the single-feeding grid array antenna in FIG. 2.

According to an exemplary embodiment, the radiative antenna element may be a single-feeding grid array antenna. Please refer to FIG. 2 and FIG. 3, and briefly to FIG. 1. FIG. 2 is a schematic top view of an antenna structure having a single-feeding GAA according to one embodiment of the invention. FIG. 3 is a perspective view showing an enlarged portion of the single-feeding GAA in FIG. 2. As shown in FIG. 2 and FIG. 3, the single-feeding GAA 220a consists of rectangular meshes 221 of microstrip lines comprising long sides 221a and short sides 221b. The long sides 221a and short sides 221b may have different line widths and lengths. According to an exemplary embodiment, a line width of the short side is greater than that of the long side. According to an exemplary embodiment, a length of the long side may be equal to λ and a length of the short side may be equal to λ/2. The single-feeding GAA 220a may be disposed on an upper surface of the substrate 200 and is backed by a metallic ground plane 211. The characteristics of the single-feeding GAA 220a can be adjusted by changing the electrical length of both long and short sides of the meshes 221.

The ground plane 211 functions as a ground reflector of the antenna structure 20a. The ground plane 211 comprises an aperture 211a for accommodating the feeding terminal 31. The connector 212 of the feeding terminal 31 passes through the aperture 211a of the ground plane 211 and is not in contact with the ground plane 211. Two coupling elements 230a and 230b are disposed in proximity to the feeding terminal 31. As depicted in FIG. 1 and FIG. 3, the coupling element 230a comprises a conductive pad 222a and a connector 212a that electrically couple the conductive pad 222a to the ground plane 211. According to one embodiment, the coupling element 230b comprises a conductive pad 222b and a connector 212b that electrically couple the conductive pad 222b to the ground plane 211. The distance $d_1$ between the conductive pad 222a and the short side 221b of the antenna element 220a may be equal to or smaller than $0.4\lambda$. The distance $d_2$ between the conductive pad 222b and short side 221b of the antenna element 220a may be equal to or smaller than $0.4\lambda$. The distance $d_1$ may be equal to or different from the distance $d_2$. By providing the grounded coupling elements 230a and 230b in proximity to the antenna feeding point, a high-gain (13.2 dB-14.1 dB) radiation pattern can be achieved and the operation bandwidth can be well controlled.

As shown in FIG. 2 and FIG. 3, one end of the transmission line 341 is electrically coupled to a lower end of the feeding terminal 31. The transmission line 341 is part of a feeding network and is disposed under the ground plane 211. An upper end of the feeding terminal 31 is electrically coupled to the radiative antenna element 220. The RF signals such as mmW signals to or from the radiative antenna element 220 may be transmitted through the transmission line 341 in the conductor layer 340 and the feeding terminal 31. According to one embodiment, a plurality of ground vias 324 may be disposed on two sides of the transmission line 341 to form a GSG (ground-signal-ground) configuration. The plurality of ground vias 324 may function as a waveguide via fence, which reduces the antenna backward radiation and improve the isolation between the antenna and RF chip. The plurality of ground vias 324 may be formed in the re-wiring structure 300 in FIG. 1 and may be coplanar with the vias 322.

Figure 4:
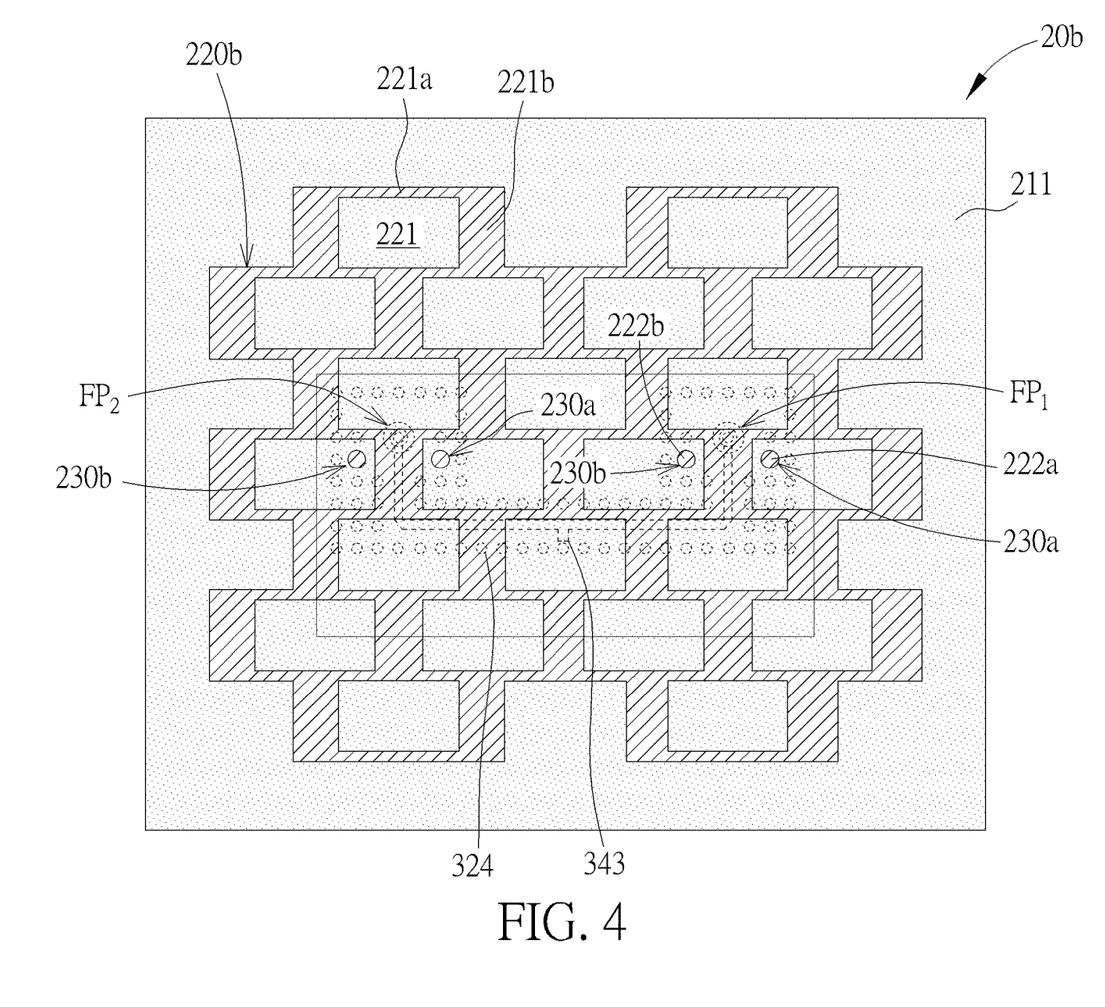
FIG. 4 illustrates an exemplary dual-feeding combined GAA according to another embodiment of the invention.

According to another exemplary embodiment, the radiative antenna element may be a dual-feeding grid array antenna. FIG. 4 illustrates an exemplary dual-feeding combined GAA according to another embodiment of the invention. As shown in FIG. 4, the antenna structure 20b comprises two feeding points $FP_1$ and $FP_2$. The dual-feeding combined GAA 220b is connected to the T-junction network 343 through the two feeding points $FP_1$ and $FP_2$. The T-junction network 343 may be disposed under the ground plane 211. Likewise, two exemplary coupling elements 230a and 230b are disposed in proximity to the feeding terminal 31 at each of the two feeding points $FP_1$ and $FP_2$. As depicted in FIG. 1, the coupling element 230a comprises a conductive pad 222a and a connector 212a that electrically couple the conductive pad 222a to the ground plane 211. According to one embodiment, the coupling element 230b comprises a conductive pad 222b and a connector 212b that electrically couple the conductive pad 222b to the ground plane 211.

Figure 5:
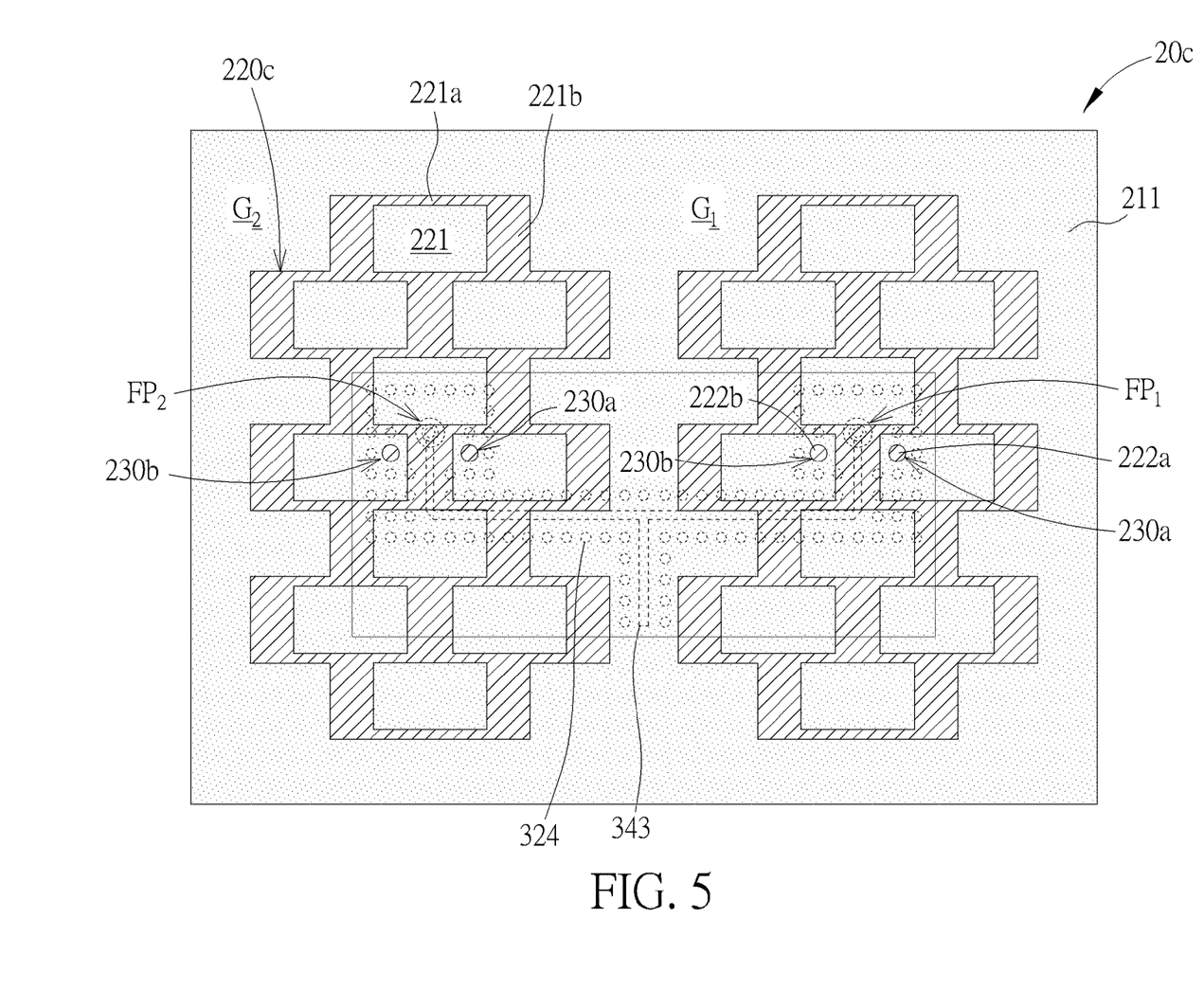
FIG. 5 illustrates an exemplary dual-feeding separated GAA according to still another embodiment of the invention.

FIG. 5 illustrates an exemplary dual-feeding separated GAA according to still another embodiment of the invention. As shown in FIG. 5, the difference between the antennas structure 20c in FIG. 5 and the antenna structure 20b in FIG. 4 is that the dual-feeding separated GAA 220c is divided into two groups $G_1$ and $G_2$ of rectangular meshes 221. Likewise, the two groups $G_1$ and $G_2$ of rectangular meshes 221 of the dual-feeding separated GAA 220c are connected to the T-junction network 343 through the two feeding points $FP_1$ and $FP_2$, respectively. Likewise, two exemplary coupling elements 230a and 230b are disposed in proximity to the feeding terminal 31 at each of the two feeding points $FP_1$ and $FP_2$. As depicted in FIG. 1, the coupling element 230a comprises a conductive pad 222a and a connector 212a that electrically couple the conductive pad 222a to the ground plane 211. The coupling element 230b comprises a conductive pad 222b and a connector 212b that electrically couple the conductive pad 222b to the ground plane 211.

Figure 6:
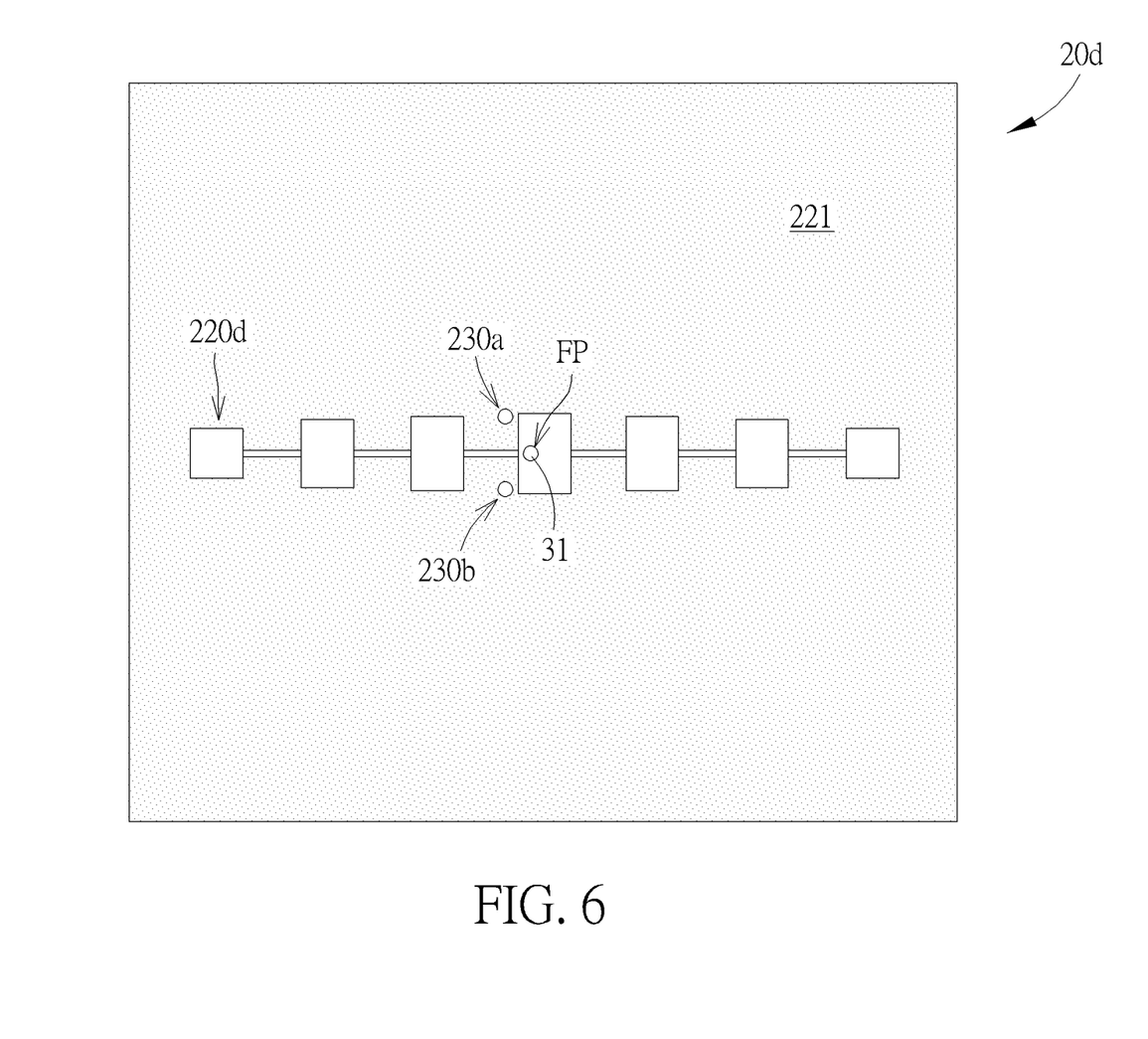
FIG. 6 illustrates an exemplary antenna structure having a single-feeding patch array antenna backed by a ground plane according to still another embodiment of the invention.

According to still another exemplary embodiment, the radiative antenna element may be a single-feeding patch array antenna. FIG. illustrates an exemplary antenna structure 20d having a single-feeding patch array antenna 220d backed by a ground plane 211. Likewise, two exemplary coupling elements 230a and 230b are disposed in proximity to the feeding terminal 31 at the feeding point FP. As depicted in FIG. 1, the coupling element 230a comprises a conductive pad 222a and a connector 212a that electrically couple the conductive pad 222a to the ground plane 211. The coupling element 230b comprises a conductive pad 222b and a connector 212b that electrically couple the conductive pad 222b to the ground plane 211.

Figure 7:
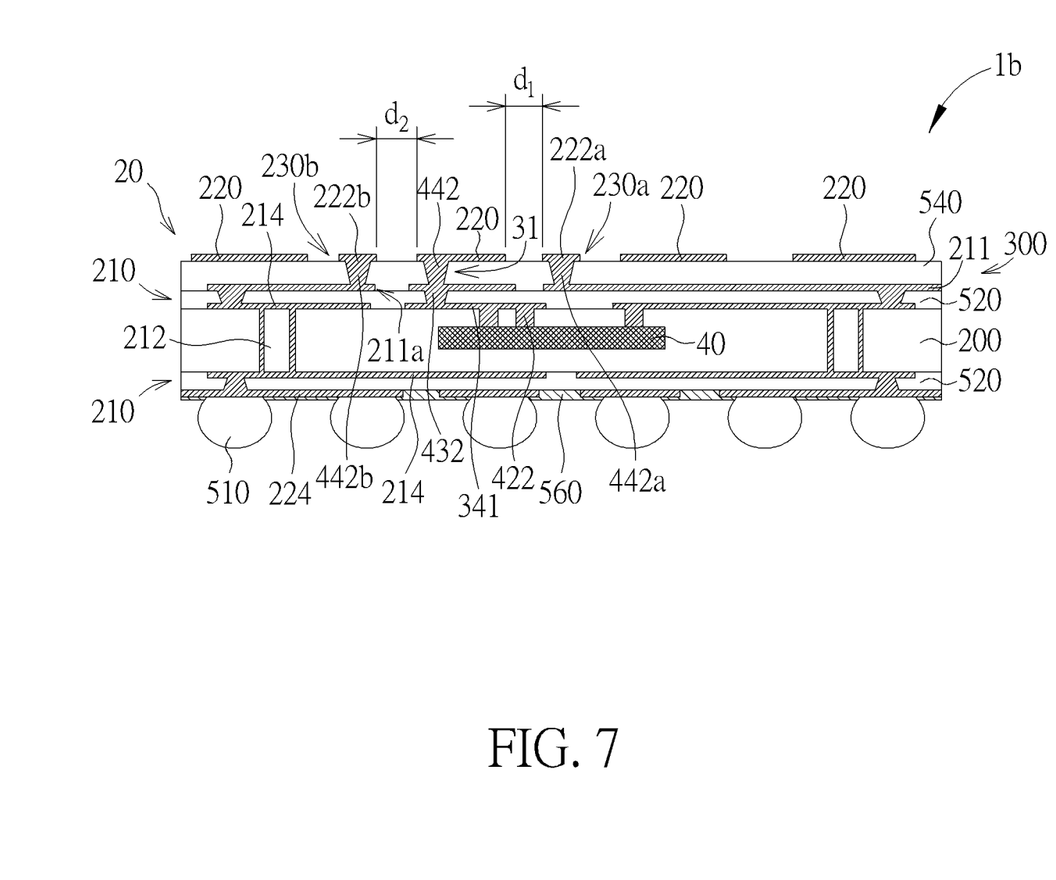
FIG. 7 to FIG. 9 are schematic, cross-sectional diagrams showing some exemplary antenna-in-packages according to various embodiments of the invention.
Figure 8:
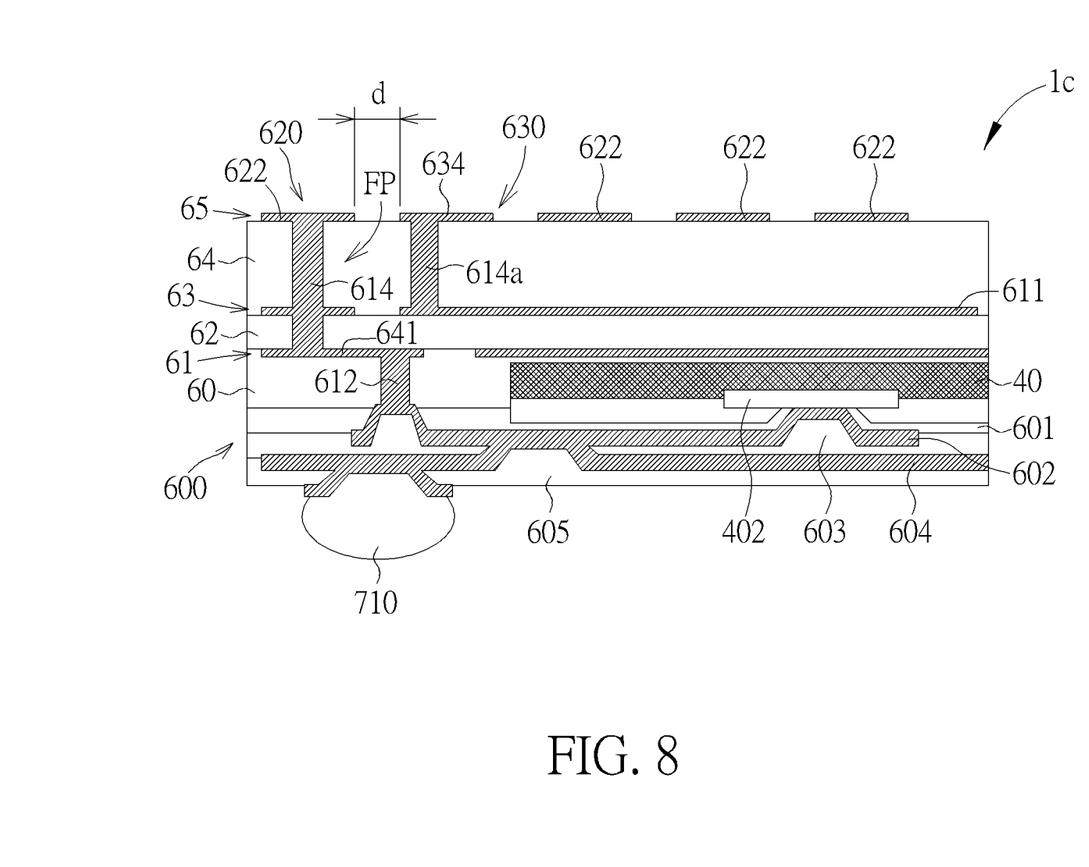
Figure 9:
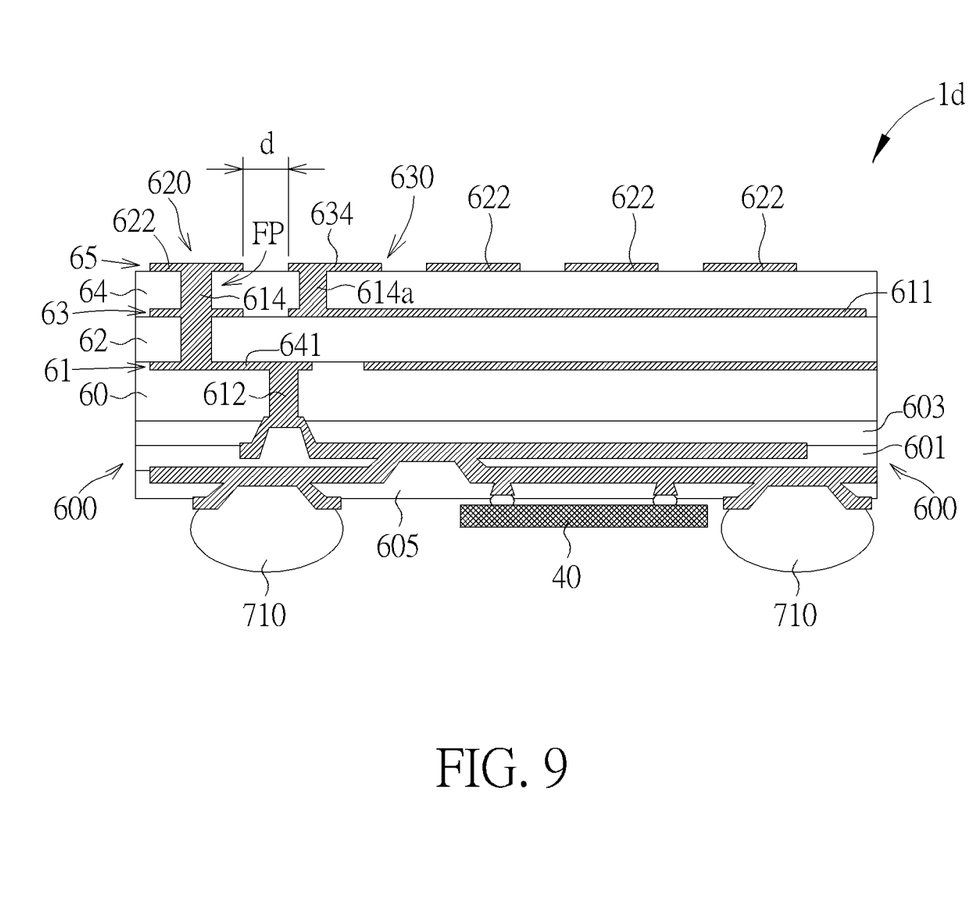

FIG. 7 to FIG. 9 are schematic, cross-sectional diagrams showing some exemplary antenna-in-packages according to various embodiments of the invention. It is to be understood that the features of the various exemplary embodiments described herein may be combined with each other, unless specifically noted otherwise. For the sake of simplicity, only germane parts of the exemplary antenna packages are shown in the figures.

As shown in FIG. 7, likewise, the antenna-in-package 1b comprises a core or a substrate 200. An antenna structure 20 is disposed in and on the substrate 200. The antenna structure 20 is configured to operate with a predetermined RF signal such as mmW signal having a RF frequency (e.g., an impedance bandwidth ranging between 76 GHz~81 GHz) and a corresponding wavelength $\lambda$. For example, the substrate 200 may be a ceramic substrate, a semiconductor substrate, a dielectric substrate, a glass substrate, but is not limited thereto. According to one embodiment, the substrate 200 may be a package substrate or a printed circuit board (PCB) comprising, for example, FR4 materials or high-performance millimeter-wave PCB materials, but is not limited thereto. Conductive layers 210 are formed on opposite surfaces of the substrate 200.

Dielectric layers 520 and conductive traces 214, 224 are formed on opposite surfaces of the substrate 200. A protective layer 560 may be disposed to cover the conductive trace 224 and the dielectric layers 520. The dielectric layer 520 may comprise any suitable insulating layers such as silicon oxide, silicon nitride, polyimide or the like. The protective layer 560 may comprise any suitable passivation layers or solder masks. The substrate 200 may comprise one or more connectors 212 such as plated through-holes to route signals from one side of the substrate 200 to the other side of the substrate 200.

According to embodiments of the invention, for example, the antenna-in-package 1b may be an embedded-chip package, which is a package embedded with a semiconductor chip 40. In a non-limiting example, the semiconductor chip 40 may embedded in the substrate 200. The semiconductor chip 40 may be electrically connected to the conductive trace 214 through the contact elements 422. Solder balls 510 such as ball grid array (BGA) may be provided on the lower surface of the antenna-in-package 1b.

The antenna structure 20 may be fabricated on an upper surface of the substrate 200. According to one embodiment, the antenna structure 20 comprises a radiative antenna element 220, which may be disposed on a surface of the dielectric layer 540. The radiative antenna element 220 may comprise an antenna array or a mechanism for radiating and/or receiving electro-magnetic signals such as RF wireless signals or mmW signals. The radiative antenna element 220 may be of any suitable type, such as grid array antennas, patch antennas, stacked patches, dipoles, monopoles, etc., and may have different orientations and/or polarizations.

Likewise, a transmission line 341 for transmitting RF signals or mmW signals is disposed in the conductive layer 210. One end of the transmission line 341 is electrically coupled to a feeding terminal 31 that is comprised of a via 432 in the dielectric layer 520 and a via 442 in the dielectric layer 540. According to one embodiment, the via 442 may be aligned with the via 432. An upper end of the feeding terminal 31 is electrically coupled to the radiative antenna element 220. The RF signals such as mmW signals to or from the radiative antenna element 220 may be transmitted through the transmission line 341 and the feeding terminal 31.

A ground plane 211 is disposed between the conductive layer 210 and the radiative antenna element 220. The ground plane 211 functions as a ground reflector of the antenna structure 20. For example, the ground plane 211 is disposed on the dielectric layer 520 and the ground plane 211 comprises an aperture 211a for accommodating the feeding terminal 31. The vias 432 and 442 of the feeding terminal 31 passes through the aperture 211a of the ground plane 211 and is not in contact with the ground plane 211.

According to one embodiment, for example, two coupling elements 230a and 230b are disposed in proximity to the feeding terminal 31. According to one embodiment, the coupling element 230a may comprise a conductive pad 222a and a via 442a that electrically couple the conductive pad 222a to the ground plane 211. According to one embodiment, the coupling element 230b may comprise a conductive pad 222b and a via 442b that electrically couple the conductive pad 222b to the ground plane 211. The distance $d_1$ between the conductive pad 222a and the radiative antenna element 220 may be equal to or smaller than 0.4λ. The distance $d_2$ between the conductive pad 222b and the radiative antenna element 220 may be equal to or smaller than 0.4λ. The distance $d_1$ may be equal to or different from the distance $d_2$.

As shown in FIG. 8, the antenna-in-package 1c may be a fan-out type chip package, wherein at least some of the package pads and/or conducting lines connecting the chip to the package pads are located laterally outside of the outline of the chip or do at least intersect the outline of the chip. Furthermore, the antenna-in-package 1c could be a wafer level chip scale package (WLCSP). In a non-limiting example, the antenna-in-package 1c may comprise a semiconductor chip 40 encapsulated by a molding compound 60. The molding compound 60 may cover the inactive bottom surface and four sidewall surfaces of the semiconductor chip 40 and may expose an active surface of the semiconductor chip 40. On the active surface of the semiconductor chip 40, a plurality of bonding pads or input/output (I/O) pads 402 are arranged.

A re-distribution layer (RDL) structure 600 may be disposed on the active surface of the semiconductor chip 40 and on a surface of the molding compound 60 and may be electrically connected to the I/O pads 402 of the semiconductor chip 40. In a non-limiting example, the RDL structure 600 may comprise dielectric layers 601, 603, and 605, and conductor layers 602, 604 in the dielectric layers 601, 603, and 605. At least one conductive element 710 such as a solder bump, a solder ball, or a metal bump/pillar may be formed on the dielectric layer 605 for further connection with an external board such as a printed circuit board or a system board. The dielectric layers 601, 603, and 605 may comprise any suitable insulating layers such as silicon oxide, silicon nitride, polyimide or the like. The conductor layers 602, 604 may comprise copper, but is not limited thereto.

In a non-limiting example, the antenna-in-package 1c may comprise a conductive layer 61 on the molding compound 60, a molding compound 62 on the molding compound 60 and on the conductive layer 61, a conductive layer 63 on the molding compound 62, a molding compound 64 on the molding compound 62 and on the conductive layer 63, and a conductive layer 65 on the molding compound 64. Through mold vias 612 may be disposed in the molding compound 60 for the signal transmission between the RDL structure 600 and the transmission line 641 in the conductive layer 61. According to one embodiment, the thicknesses of the molding compounds 60, 62, and 64 may be different from one another, but is not limited thereto.

An antenna structure 620 is fabricated in the conductive layers 61, 63, and 65 and the molding compounds 60, 62, and 64. A radiative antenna element 622 may be disposed in the conductive layer 65. The radiative antenna element 622 may comprise an antenna array or a mechanism for radiating and/or receiving electro-magnetic signals such as RF wireless signals or mmW signals. Some examples of such radiative antenna element are shown through FIG. 2 to FIG. 6. A ground plane 611 is disposed in the conductive layer 63 between the radiative antenna element 622 and the conductive layer 61. A via 614 extending through the molding compound 62 and 64 electrically connects the radiative antenna element 622 to the transmission line 641 at the feeding point FP. At least one coupling element 630 is disposed in proximity to the feeding point FP. The coupling element 630 may comprise a conductive pad 634 and a via 614a that electrically couple the conductive pad 634 to the ground plane 611. According to one embodiment, the distance d between the conductive pad 634 and the radiative antenna element 622 may be equal to or smaller than 0.4λ.

As shown in FIG. 9, the antenna-in-package 1d may have a similar stack structure as that depicted in FIG. 8. The difference between the antenna-in-package 1d in FIG. 9 and the antenna-in-package 1c depicted in FIG. 8 is that the semiconductor chip 40 of the antenna-in-package 1d is externally mounted on the RDL structure 600. The semiconductor chip 40 may be a bare die, but is not limited thereto. Likewise, the antenna-in-package 1d may comprise a conductive layer 61 on the molding compound 60, a molding compound 62 on the molding compound 60 and on the conductive layer 61, a conductive layer 63 on the molding compound 62, a molding compound 64 on the molding compound 62 and on the conductive layer 63, and a conductive layer 65 on the molding compound 64. Through mold vias 612 may be disposed in the molding compound 60 for the signal transmission between the RDL structure 600 and the transmission line 641 in the conductive layer 61. According to one embodiment, the thicknesses of the molding compounds 60, 62, and 64 may be different from one another, but is not limited thereto.

An antenna structure 620 is fabricated in the conductive layers 61, 63, and 65 and the molding compounds 60, 62, and 64. A radiative antenna element 622 may be disposed in the conductive layer 65. The radiative antenna element 622 may comprise an antenna array or a mechanism for radiating and/or receiving electro-magnetic signals such as RF wireless signals or mmW signals. Some examples of such radiative antenna element are shown through FIG. 2 to FIG. 6. A ground plane 611 is disposed in the conductive layer 63 between the radiative antenna element 622 and the conductive layer 61. A via 614 extending through the molding compound 62 and 64 electrically connects the radiative antenna element 622 to the transmission line 641 at the feeding point FP. At least one coupling element 630 is disposed in proximity to the feeding point FP. The coupling element 630 may comprise a conductive pad 634 and a via 614a that electrically couple the conductive pad 634 to the ground plane 611. According to one embodiment, the distance d between the conductive pad 634 and the radiative antenna element 622 may be equal to or smaller than 0.4λ.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An antenna structure, comprising:
    a substrate having a top surface and a bottom surface;
    a radiative antenna element disposed in a first conductive layer;
    a reflector ground plane disposed in a second conductive layer under the first conductive layer;
    a feeding network comprising a transmission line disposed in a third conductive layer under the second conductive layer, wherein a feeding terminal is disposed to electrically couple one end of the transmission line to the radiative antenna element;
    a re-wiring structure disposed on the bottom surface of the substrate, wherein the third conductive layer and the transmission line are disposed in the re-wiring structure; and
    at least one coupling element disposed in proximity to the feeding terminal, wherein the coupling element is capacitively coupled with the feeding terminal.

2. The antenna structure according to claim 1, wherein the coupling element comprises a conductive pad and a connector that electrically couples the conductive pad to the reflector ground plane.

3. The antenna structure according to claim 2, wherein the antenna structure is configured to operate with a predetermined RF signal having a RF frequency and a corresponding wavelength λ, wherein a distance between the conductive pad and the radiative antenna element is equal to or smaller than 0.4λ.

4. The antenna structure according to claim 3, wherein the RF frequency comprises an impedance bandwidth ranging between 76 GHz-81 GHz.

5. The antenna structure according to claim 2, wherein the conductive pad is disposed in the first conductive layer and is coplanar with the radiative antenna element.

6. The antenna structure according to claim 1, wherein the substrate comprises a ceramic substrate, a semiconductor substrate, a dielectric substrate, or a glass substrate.

7. The antenna structure according to claim 1, wherein the substrate comprises a package substrate or a printed circuit board.

8. The antenna structure according to claim 1, wherein the first conductive layer is disposed on the top surface of the substrate and the second conductive layer is disposed on the bottom surface of the substrate.

9. The antenna structure according to claim 8, wherein the reflector ground plane is disposed on the bottom surface of the substrate.

10. The antenna structure according to claim 1, wherein the first conductive layer, the second conductive layer, and the third conductive layer are disposed on the top surface of the substrate.

11. The antenna structure according to claim 1, wherein the feeding terminal is comprised of a connector in the substrate and a via in the re-wiring structure.

12. The antenna structure according to claim 11, wherein the connector is a plated through hole, and wherein the plated through hole is aligned with the via.

13. The antenna structure according to claim 1, wherein the reflector ground plane comprises an aperture for accommodating the feeding terminal, and wherein the feeding terminal passes through the aperture of the reflector ground plane and is not in contact with the reflector ground plane.

14. The antenna structure according to claim 1, wherein the radiative antenna element comprises a grid array antenna.

15. The antenna structure according to claim 14, wherein the grid array antenna comprises a single-feeding grid array antenna or a dual-feeding grid array antenna.

16. The antenna structure according to claim 1, wherein the radiative antenna element comprises a patch array antenna.

17. An antenna structure, comprising:
    a substrate having a top surface and a bottom surface;
    a radiative antenna element disposed in a first conductive layer;
    a reflector ground plane disposed in a second conductive layer under the first conductive layer;
    a feeding network comprising a transmission line disposed in a third conductive layer under the second conductive layer, wherein a feeding terminal is disposed to electrically couple one end of the transmission line to the radiative antenna element;
    a re-wiring structure disposed on the bottom surface of the substrate, wherein the third conductive layer and the transmission line are disposed in the re-wiring structure; and
    two coupling elements sandwiching about the feeding terminal, wherein the two coupling elements are capacitively coupled with the feeding terminal.

18. An antenna-in-package, comprising:
    an antenna structure, comprising:
        a substrate having a top surface and a bottom surface;
        a radiative antenna element disposed in a first conductive layer;
        a reflector ground plane disposed in a second conductive layer under the first conductive layer;
        a feeding network comprising a transmission line disposed in a third conductive layer under the second conductive layer, wherein a feeding terminal is disposed to electrically couple one end of the transmission line to the radiative antenna element;
        a re-wiring structure disposed on the bottom surface of the substrate, wherein the third conductive layer and the transmission line are disposed in the re-wiring structure; and
        at least one coupling element disposed in proximity to the feeding terminal, wherein the coupling element is capacitively coupled with the feeding terminal; and a semiconductor chip embedded in or mounted on a substrate and electrically coupled to the antenna structure.

\* \* \* \* \*